United States Patent
Huang et al.

(10) Patent No.: US 10,212,821 B2
(45) Date of Patent: Feb. 19, 2019

(54) FLEXIBLE SUBSTRATE ASSEMBLY AND ITS APPLICATION FOR FABRICATING FLEXIBLE PRINTED CIRCUITS

(71) Applicant: TAIMIDE TECHNOLOGY INCORPORATION, Hsinchu County (TW)

(72) Inventors: Yen-Po Huang, Hsinchu Hsien (TW); Tsung-Hsien Tsai, Hsinchu Hsien (TW)

(73) Assignee: Taimide Technology Incorporation, Hsinchu County (TW)

( * ) Notice: Subject to any disclaimer, the term of this patent is extended or adjusted under 35 U.S.C. 154(b) by 107 days.

(21) Appl. No.: 15/365,674

(22) Filed: Nov. 30, 2016

(65) Prior Publication Data

US 2018/0042125 A1 Feb. 8, 2018

(30) Foreign Application Priority Data

Aug. 4, 2016 (TW) .............................. 105124732 A
Aug. 30, 2016 (TW) .............................. 105127765 A

(51) Int. Cl.
*H05K 1/03* (2006.01)
*H05K 3/00* (2006.01)
(Continued)

(52) U.S. Cl.
CPC ......... *H05K 3/007* (2013.01); *C03C 17/3405* (2013.01); *C08G 73/105* (2013.01); *C08G 73/1071* (2013.01); *C08L 79/08* (2013.01); *C09D 179/08* (2013.01); *H01L 21/6835* (2013.01); *H01L 23/4985* (2013.01);
(Continued)

(58) Field of Classification Search
CPC .... H05K 3/007; H05K 1/0393; H05K 3/4682; H05K 3/4691; H05K 2201/05; H05K 2203/0264; H05K 2203/0152; H05K 2203/016; C03C 17/3405; C03C 2218/11; C03C 2218/32; H01L 21/6835; H01L 23/4985; H01L 23/49894; H01L 2221/68345; H01L 2221/68386;
(Continued)

(56) References Cited

FOREIGN PATENT DOCUMENTS

JP  2005-194527  7/2005
JP  2015-227418  12/2015
(Continued)

OTHER PUBLICATIONS

English translation of JP2005194527.*
(Continued)

*Primary Examiner* — Sonya M Sengupta
(74) *Attorney, Agent, or Firm* — Baker & McKenzie LLP

(57) ABSTRACT

A method of fabricating a flexible printed circuit includes providing a carrying support comprised of a rigid support base and a release layer adhered in contact with each other, forming a flexible substrate on the carrying support, the formed flexible substrate being adhered in contact with the release layer, applying one or more processing step on the flexible substrate while the flexible substrate is supported by the carrying support, and peeling the flexible substrate with an electric circuit formed thereon from the release layer while the release layer remains adhered in contact with the support base.

17 Claims, 4 Drawing Sheets

(51) Int. Cl.
| | |
|---|---|
| *H05K 3/46* | (2006.01) |
| *C03C 17/34* | (2006.01) |
| *H01L 21/683* | (2006.01) |
| *C08G 73/10* | (2006.01) |
| *C08L 79/08* | (2006.01) |
| *C09D 179/08* | (2006.01) |
| *H01L 23/498* | (2006.01) |
| *C08L 27/18* | (2006.01) |
| *C08K 5/544* | (2006.01) |

(52) U.S. Cl.
CPC ..... *H01L 23/49894* (2013.01); *H05K 1/0393* (2013.01); *H05K 3/4682* (2013.01); *H05K 3/4691* (2013.01); *C03C 2218/11* (2013.01); *C03C 2218/32* (2013.01); *C08G 73/1039* (2013.01); *C08G 73/1067* (2013.01); *C08L 2203/20* (2013.01); *H01L 2221/68345* (2013.01); *H01L 2221/68386* (2013.01); *H05K 2201/0154* (2013.01); *H05K 2201/05* (2013.01); *H05K 2203/016* (2013.01); *H05K 2203/0152* (2013.01); *H05K 2203/0264* (2013.01)

(58) Field of Classification Search
CPC ... C08L 79/08; C08L 2203/20; C08G 73/105; C08G 73/1071; C08G 73/1039; C08G 73/1067
USPC .......................... 156/235, 236, 241, 247, 322
See application file for complete search history.

(56) References Cited

FOREIGN PATENT DOCUMENTS

| | | |
|---|---|---|
| JP | 2015227418 A | * 12/2015 |
| KR | 20150038080 | 4/2015 |
| TW | 201412552 | 4/2014 |

OTHER PUBLICATIONS

English translation of JP2015227418.*
English translation of KR20150038080.*
Reason for Refusal of KR10-2016-0161116.*
English translation of TW201412552.*
Office Action dated Apr. 10, 2018 in connection with Korean Application No. 10-2016-0161115, 15 pages.

* cited by examiner

FLEXIBLE SUBSTRATE ASSEMBLY AND ITS APPLICATION FOR FABRICATING FLEXIBLE PRINTED CIRCUITS

CROSS-REFERENCE TO RELATED APPLICATION(S)

This application claims priority to Taiwan Patent Application No. 105124732 filed on Aug. 4, 2016 and Taiwan Patent Application No. 105127765 filed on Aug. 30, 2016, the disclosure of which is incorporated herein by reference.

BACKGROUND OF THE DISCLOSURE

1. Field of the Disclosure

The present application relates to a flexible substrate assembly and its application for fabricating flexible printed circuits.

2. Description of the Related Art

Traditional flat panel displays may include relatively heavyweight and thick glass substrates. As display devices become increasingly thinner and more constraints are imposed for reducing the manufacture cost, the glass substrate is progressively replaced with a flexible plastic substrate. The manufacture of such display devices usually includes forming the flexible plastic substrate on a support body, forming an integrated circuit or an electric circuit on the flexible plastic substrate, and then detaching the flexible plastic substrate from the support.

A known approach uses a laser for detaching the flexible substrate from the support body. However, the laser technique may induce thermal expansion, causing damage to the flexible substrate and the electric circuit formed thereon. Moreover, laser equipment is very expensive, which may be incompatible with the goal of reducing the manufacture cost.

Taiwan Patent No. 1444114 appears to disclose another approach in which the flexible substrate may be coated on an intermediate layer that is removably attached to a support body. After the formation of a display device is completed, the intermediate layer with the flexible substrate thereon may be detached from the support body. This approach requires forming a new intermediate layer for the fabrication of each new flexible substrate, which may adversely increase the manufacture cost.

Therefore, there is a need for an improved fabrication process that can address at least the foregoing issues.

SUMMARY

The present application describes a method of fabricating a flexible printed circuit. The method includes providing a carrying support comprised of a support base and a release layer adhered in contact with each other, forming a flexible substrate on the carrying support, the formed flexible substrate being adhered in contact with the release layer, applying one or more processing step on the flexible substrate while the flexible substrate is supported by the carrying support, and peeling the flexible substrate with an electric circuit formed thereon from the release layer while the release layer remains adhered in contact with the support base.

According to another example of implementation, a method of fabricating flexible printed circuits includes providing a carrying support comprised of a rigid support base and a release layer adhered in contact with each other, forming a first flexible substrate on the carrying support, the first flexible substrate being adhered in contact with the release layer, forming a first electric circuit on the first flexible substrate, while the release layer remains adhered in contact with the support base, peeling the first flexible substrate with the first electric circuit thereon from the release layer to expose a surface of the release layer, forming a second flexible substrate on the exposed surface of the release layer, the second flexible substrate being adhered in contact with the release layer, forming a second electric circuit on the second flexible substrate, and while the release layer remains adhered in contact with the support base, peeling the second flexible substrate with the second electric circuit thereon from the release layer. In the described method, the release layer and the flexible substrate respectively comprises a polyimide layer.

DETAILED DESCRIPTION OF THE EMBODIMENTS

Figure 1:
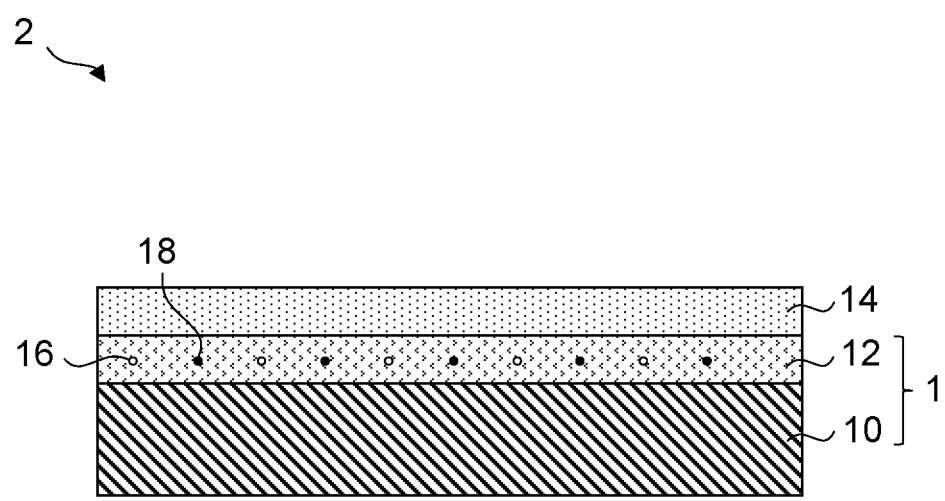
FIG. 1 is a schematic view illustrating an embodiment of a flexible substrate assembly.

FIG. 1 is a schematic view illustrating an embodiment of a flexible substrate assembly 2. Referring to FIG. 1, the flexible substrate assembly 2 includes a carrying support 1 comprised of a support base 10 and a release layer 12 stacked on each other, and a flexible substrate 14 formed as a polyimide layer adhered in contact with the release layer 12. The carrying support 1 can provide rigid support for the flexible substrate 14 during a manufacturing process. For example, the flexible substrate 14 supported by the carrying support 1 may be subjected to various processing steps, which may include, without limitation, metal deposition, chemical vapor deposition, and etching steps. Moreover, the carrying support 1 allows easy removal of the flexible substrate 14 from the carrying support 1 by peeling the flexible substrate 14 from the release layer 12.

The support base 10 of the carrying support 1 can be made of a rigid material, and may not be easily bent. For example, the support base 10 can be a plate or wafer made of glass, metal, silicon, or the like.

The release layer 12 of the carrying support 1 is adhered in contact with the support base 10. The release layer 12 can be a single layer that includes polyimide as base material and incorporates two different fillers including an adhesion promoting agent 16 and a release agent 18.

The polyimide of the release layer 12 can be derived from reaction of diamine monomers with dianhydride monomers. Examples of the diamine monomers used for forming the polyimide of the release layer 12 may include 4,4'-oxydianiline (4,4'-ODA), phenylenediamine (p-PDA), 2,2'-bis (trifluoromethyl)benzidine (TFMB), 1,3-bis(4-aminophenoxy)benzene (TPER), 1,4-bis(4-aminophenoxy)benzene (TPEQ), 2,2'-dimethyl[1,1'-biphenyl]-4,4'-diamine (m-TB-HG), 1,3'-bis(3-aminophenoxy) benzene (APBN), 3,5-diamino benzotrifluoride (DABTF), 2,2'-bis[4-(4-aminophenoxy) phenyl]propane (BAPP), 6-amino-2-(4-aminophenyl) benzoxazole (6PBOA), 5-amino-2-(4-aminophenyl) benzoxazole (5PBOA). In some examples of implementation, the diamine monomers may be selected from the group consisting of 4,4'-ODA, p-PDA and TFMB.

Examples of the dianhydride monomers used for forming the polyimide of the release layer 12 may include 3,3',4,4'-biphenyltetracarboxylic dianhydride (BPDA), 2,2-bis [4-(3, 4dicarboxyphenoxy) phenyl] propane dianhydride (BPADA), pyromellitic dianhydride (PMDA), 2,2'-Bis-(3,4-dicarboxyphenyl) hexafluoropropane dianhydride (6FDA), 4,4-oxydiphtalic anhydride (ODPA), benzophenonetetracarboxylic dianhydride (BTDA), 3,3',4,4'-dicyclohexyltetracarboxylic acid dianhydride (HBPDA). In some examples of implementation, the dianhydride monomers may be selected from the group consisting of PMDA, BPDA and BPADA.

Examples of the adhesion promoting agent 16 can include silane compounds. The adhesion promoting agent 16 may be incorporated in the polyimide of the release layer 12 at a weight ratio between about 1 wt % and about 10 wt % based on the total weight of the release layer 12. The addition of the adhesion promoting agent 12 allows to have proper adhesion strength between the release layer 12 and the support base 10.

Examples of silane compounds used as the adhesion promoting agent 16 may include N-[3-(diethoxymethylsilyl) propyl]ethylenediamine, 3-(2-aminoethylamino)propyl-dimethoxymethylsilane, N-[3-(Trimethoxysilyl)propyl]ethylenediamine, (aminomethyl)trimethylsilane, 3-aminopropyltriethoxysilane, 3-aminopropyltrimethoxysilane, 3-amino- propyltrimethylsilane, 4-aminobutyltriethoxysilane, N-(2-aminoethyl)-3-aminopropyltriethoxysilane, (3-glycidoxypropyl)trimethoxysilane, (3-glycidyloxypropyl)triethoxysilane, 5,6-epoxyhexyltriethoxysilane, or the like, which can be used individually or in combination The release agent 18 may be incorporated in the mixture for fabricating the release layer 12 as a particulate filler that does not react with the diamine and dianhydride monomers during polymerization and is dispersed in the formed release layer 12. Examples of the release agent 18 provided in the form of a particulate filler may include a fluoride-containing compound or a siloxane compound. The release agent 18 may be incorporated in the release layer 12 at a weight ratio between about 5 wt % and about 45 wt % based on the total weight of the release layer 12. Moreover, the release agent 18 provided as a particulate filler can have an average particle diameter or size less than about 20 µm, preferably between about 5 µm and about 15 µm. The addition of the release agent 18 can reduce the surface energy of the release layer 12, which allows to produce a peeling characteristic between the release layer 12 and the flexible substrate 14. As a result, the flexible substrate 14 can be peeled from the release layer 12 by mechanically pulling the flexible substrate 14 away from the release layer 12.

Examples of fluoride-containing particulate fillers used as the release agent 18 can include polytetrafluoroethylene (PTFE), polyfluorinated ethylene propylene (FEP), perfluoroalkoxy (PFA) polymer, polychlorotrifluoroethene (PCTFE), ethylene tetrafluoroethylene (ETFE), polyfluorinated vinylidene (PVDF), polyvinylfluoride (PVF), perfluoropolyether (PEPE), perfluorosulfonic acid (PFSA) polymer, chlorotrifluoroethylene (CTFE) polymer, ethylene chlorotrifuloroethylene (ECTFE) polymer, or the like, which can be used individually or in combination.

Examples of siloxane particulate fillers used as the release agent 18 may include polydimethylsiloxane, dimethyldiphenylpolysiloxane, polymethyloctylsiloxane, (dodecylmethylsiloxane)-(2-phenylpropylmethylsiloxane) copolymer, or the like, which can be used individually or in combination.

According to some variant examples of implementation, the release agent 18 may be incorporated in the mixture for fabricating the release layer 12 as a modifier that reacts at least partially with the diamine and/or dianhydride monomers during polymerization. Examples of modifiers used as the release agent can include siloxane compounds in a liquid or solution form. The siloxane modifier can include at least one hydrophilic functional group and at least one hydrophobic functional group. The hydrophilic functional group can react with the diamine and/or dianhydride monomers for forming the polyimide structure, and the hydrophobic functional group can become exposed to reduce the surface energy of the release layer 12, which can reduce the peeling strength between the release layer 12 and the flexible substrate 14. Examples of siloxane modifiers used as the release agent can include polydimethylsiloxane (diaminopropyl terminated), aminoethylaminopropylmethylsiloxane-dimethylsiloxane copolymer and the like. The siloxane modifier used as the release agent may be incorporated at a weight ratio between about 5 wt % and about 45 wt % based on the total weight of the release layer 12.

The flexible substrate 14 is adhered in contact with the release layer 12. The flexible substrate 14 can be a single polyimide layer formed by reaction of diamine monomers with dianhydride monomers. The diamine and dianhydride monomers used for forming the flexible substrate 14 can be the same as, partially the same as, or different from those used for forming the polyimide of the release layer 12. The composition of the flexible substrate 14 may differ from that of the release layer 12 by including no adhesion promoting agent and no release agent.

By incorporating the adhesion promoting agent 16 and the release agent 18, the release layer 12 can have different adhesion strength at two opposite sides thereof: the adhesion strength between the release layer 12 and the support base 10 is higher than the adhesion strength between the release layer 12 and the flexible substrate 14. Moreover, a peeling strength between the release layer 12 and the flexible substrate 14 can be less than 0.1 kgf/cm, so that the flexible substrate 14 can be desirably peeled from the release layer 12 while the release layer 12 remains adhered to the support base 10. This allows reuse of the release layer 12 and the support base 10 after removal of the flexible substrate 14.

Figure 2:
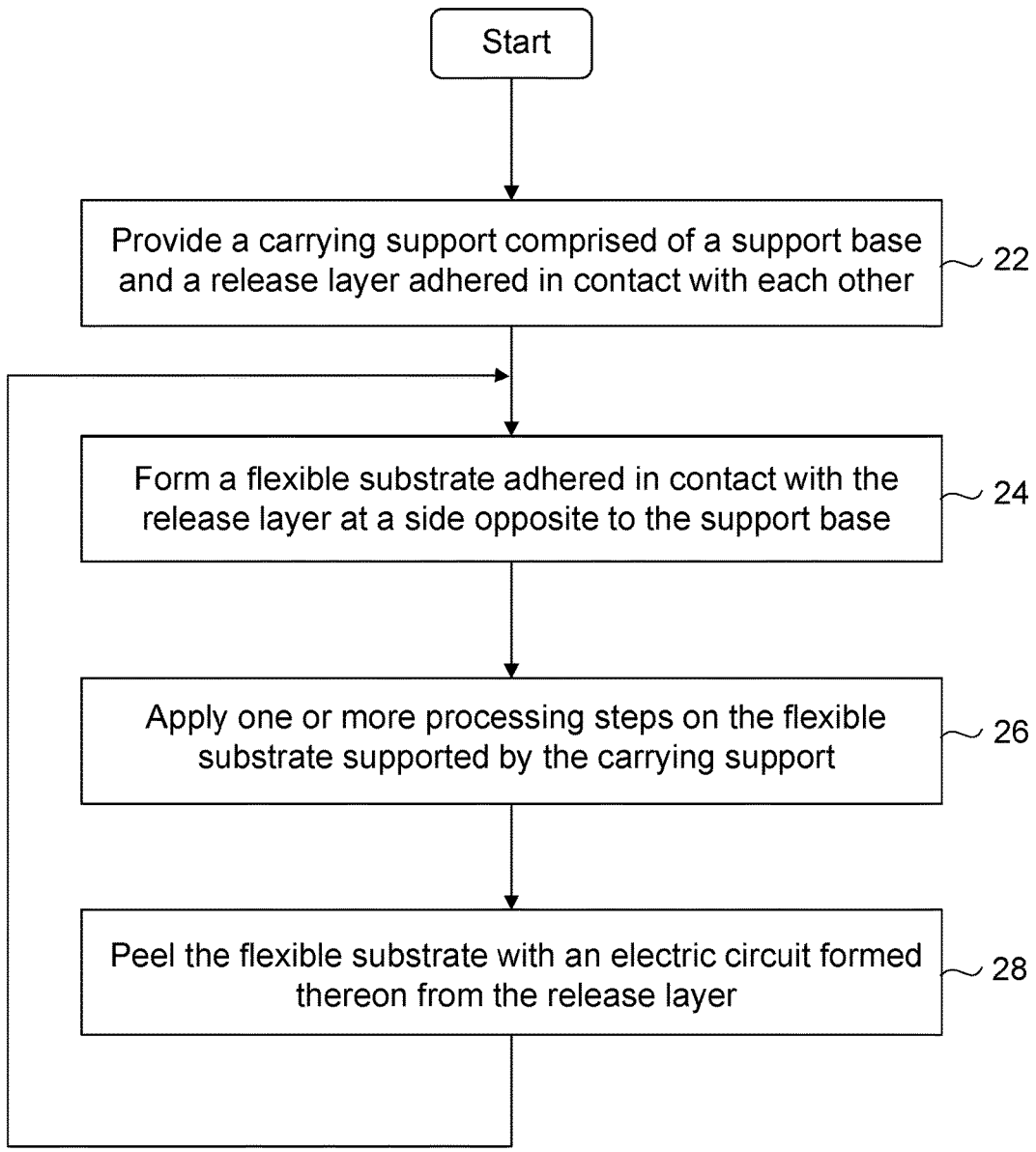
FIG. 2 is a flowchart illustrating a method of fabricating flexible printed circuits.
Figure 3:
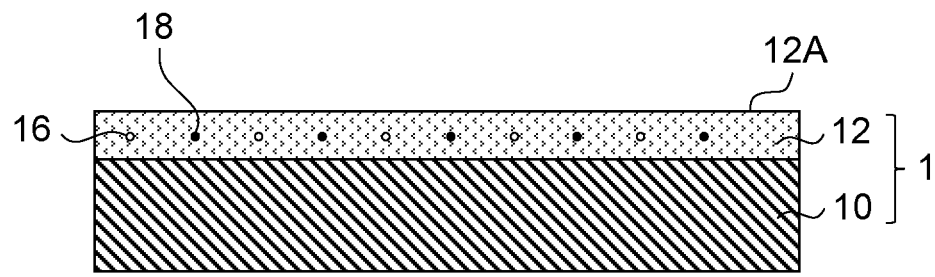
FIG. 3 is a schematic view illustrating a stage of a method of fabricating a flexible substrate assembly, according to an example embodiment of the disclosure.

Reference is made hereinafter to FIGS. 2-6 for describing a method of fabricating a flexible printed circuit, wherein FIG. 2 is a flowchart illustrating method steps in the manufacture of the flexible printed circuit, and FIGS. 3-6 are schematic views illustrating various intermediate stages corresponding to the method steps described in FIG. 2. Referring to FIGS. 2-6, the carrying support 1 is provided in initial step 22. As shown in FIG. 3, the provided carrying support 1 can include the support base 10 and the release layer 12. The support base 10 can be a plate or wafer made of a rigid material, e.g., glass, metal or silicon. A first polyamic acid (PAA) solution containing the adhesion promoting agent 16 and the release agent 18 can be prepared and coated on the support base 10, and then heated to form the release layer 12. The carrying support 1 thereby prepared has the release layer 12 adhered in contact with a surface of the support base 10, the release layer 12 having an exposed surface 12A at a side opposite to the support base 10.

Figure 4:
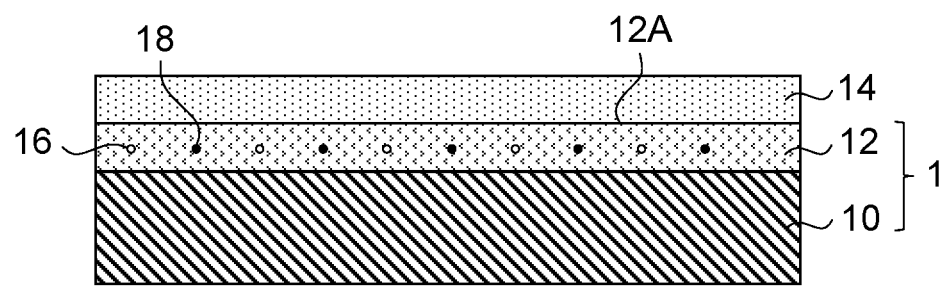
FIG. 4 is a schematic view illustrating a stage of a method of fabricating a flexible substrate assembly, according to an example embodiment of the disclosure.

In next step 24, a second PAA solution can be prepared and coated on the exposed surface 12A of the release layer 12, and then heated to form a polyimide layer serving as the flexible substrate 14. As shown in FIG. 4, the flexible substrate 14 thereby formed is adhered in contact with the surface 12A of the release layer 12 at the side opposite to the support base 10.

Figure 5:
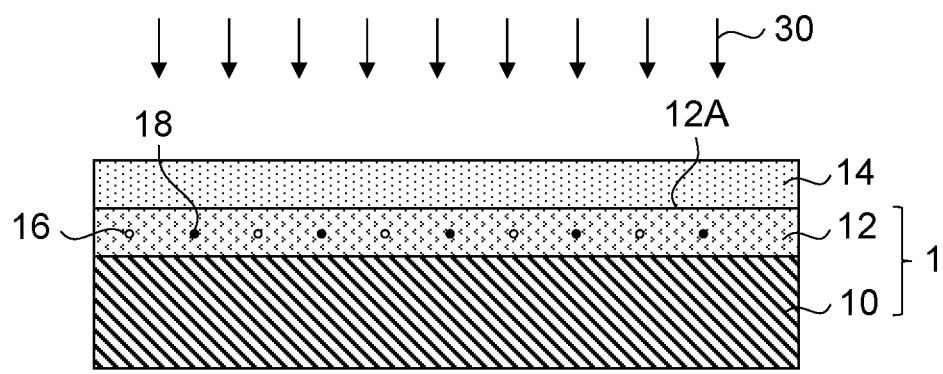
FIG. 5 is a schematic view illustrating a stage of a method of fabricating a flexible substrate assembly, according to an example embodiment of the disclosure.
Figure 6:
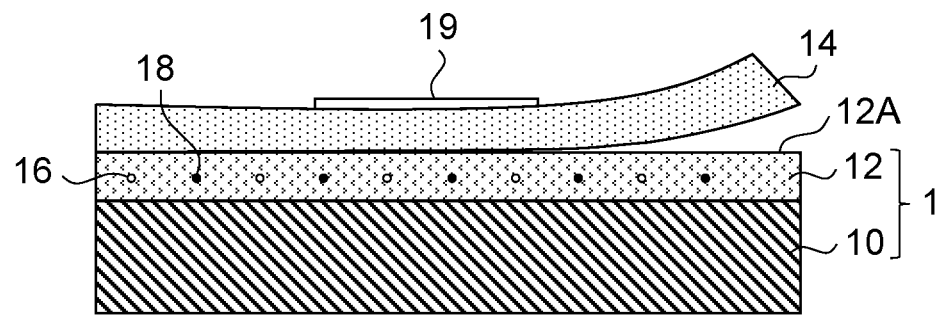
FIG. 6 is a schematic view illustrating a stage of a method of fabricating a flexible substrate assembly, according to an example embodiment of the disclosure.

In next step 26, the flexible substrate assembly comprised of the flexible substrate 14 and the carrying support 1 then can undergo one or more processing steps 30 (as also shown in FIG. 5). Examples of the processing steps 30 applied on the exposed surface of the flexible substrate 14 can include, e.g., an etching step, and a metal deposition for forming metallic trace on the flexible substrate 14.

In next step 28, after the processing steps 30 are completed, the flexible substrate 14 with an electric circuit 19 formed thereon can be peeled from the release layer 12 of the carrying support 1. Owing to the low peeling strength at the interface between the release layer 12 and the flexible substrate 14, the flexible substrate 14 may be, for example, mechanically pulled to detach from the release layer 12. The carrying support 1 then can be reused for forming another flexible substrate or flexible printed circuit on the exposed surface 12A of the release layer 12, e.g., by repeating steps 24-28 as described previously.

The flexible substrate assembly and the fabrication method described herein thus can use and reuse a same carrying support 1 for fabricating flexible printed circuits, which can advantageously reduce the overall fabrication cost of flexible printed circuits. The release layer 12 and the flexible substrate 14 of the flexible substrate assembly can be formed by thermal conversion or chemical conversion. When chemical conversion is used, a dehydrant and/or a catalyst can be added into the polyamic acid solution before the coating step. The solvent can be polar and aprotic solvent, e.g., dimethylacetamide (DMAC), N, N'-dimethylformamide (DMF), N-methyl-2-pyrrolidone (NMP), dimethyl sulfoxide (DMSO), tetramethylene sulfone, N,N'-dimethyl-N,N'-propylene urea (DMPU), and the like. The dehydrant can be aliphatic anhydride (e.g., acetic anhydride and propionic anhydride), aromatic anhydride (e.g., benzoic acid anhydride and phthalic anhydride), and the like. The catalyst can be heterocyclic tertiary amine (e.g., picoline, pyridine, and the like), aliphatic tertiary amine (e.g., trimethylamine (TEA) and the like), aromatic tertiary amine (e.g., xylidine and the like), etc. The molar ratio of polyamic acid:dehydrant:catalyst can be 1:2:1, i.e., for each mole of polyamic acid solution, about 2 moles of dehydrant and about 1 mole of catalyst are used.

In at least one example of implementation, the polyimide can be formed by condensation reaction of diamine monomers with dianhydride monomers at a substantially equal molar ratio (i.e., 1:1), e.g., the diamine-to-dianhydride molar ratio can be 0.9:1.1 or 0.98:1.02.

Further examples of fabricating a flexible substrate assembly are described hereinafter.

EXAMPLES AND COMPARATIVE EXAMPLES

Example 1

Preparation of a First PAA Solution
About 52.63 g of ODA and about 400 g of DMAC used as solvent are put into a three-necked flask, and agitated until complete dissolution. Then about 57.4 g of PMDA is added and mixed homogeneously. The quantity of the reacted monomers is 20 wt % of the total weight of the solution. The solution is continuously agitated and reaction occurs at a temperature of 25° C. for 25 hours. After completion of the reaction, 1 wt % (1.1 g) of 3-aminopropyltriethoxysilane (Z-6011, purchased from Shin-Etsu Chemical Co., Ltd.) as the adhesion promoting agent 16 and 20 wt % (22 g) of polytetrafluoroethene (PTFE)) as the release agent 18 are respectively incorporated to form a first polyamic acid (PAA) solution. The respective weight ratios of the adhesion promoting agent and the release agent are based on the total weight of the release layer to form.

Preparation of a Second PAA Solution
About 71.67 g of TFMB and about 412.5 g of DMAC used as solvent are put into a three-necked flask, and agitated until complete dissolution. Then about 65.84 g of BPDA is added. The quantity of the reacted monomers is 20 wt % of the total weight of the solution. The solution is continuously agitated and reaction occurs at a temperature of 25° C. for 25 hours to form a second PAA solution.

Preparation of a Flexible Substrate
The first PAA solution is coated onto a glass plate used as the support base 10 described previously, and heated at a temperature of 80° C. for 30 minutes to remove most of the solvent. Then, the glass plate with the coated first PAA solution thereon is placed in an oven and heated at a temperature between 170° C. and 370° C. for 4 hours to form the release layer 12. Subsequently, the second PAA solution is coated onto the release layer 12, and heated at a temperature of 80° C. for about 30 minutes. Then, the glass plate with the release layer 12 and the coated second PAA solution thereon is placed in an oven and further heated at a temperature between 170° C. and 370° C. for 4 hour to form the flexible substrate 14 adhered in contact with the release layer 12.

Examples 2-5 and Comparative Examples 1-2

Flexible substrate assemblies are prepared like in Example 1, except that the amounts of 3-aminopropyltriethoxysilane and PTFE respectively added into the first PAA solution as the adhesion promoting agent and the release agent are as indicated in Table 1.

Example 6

A flexible substrate assembly is prepared like in Example 1, except that 5 wt % (5.5 g) of 3-aminopropyltriethoxysilane and 10 wt % (11 g) of a siloxane filler polydimethylsiloxane (KF-8010, purchased from Shin-Etsu Chemical Co., Ltd.) are respectively added into the first PAA solution as the adhesion promoting agent and the release agent. The siloxane filler is in a form of particles.

Examples 7-8 and Comparative Examples 3-5

Flexible substrate assemblies are prepared like in Example 6, except that the amounts of 3-aminopropyltriethoxysilane and the siloxane filler respectively added into the first PAA solution as the adhesion promoting agent and the release agent are as indicated in Table 1.

Example 9

A flexible substrate assembly is prepared like in Example 1, except that 1 wt % of 3-aminopropyltriethoxysilane (Z-6011, purchased from Shin-Etsu Chemical Co., Ltd.) as the adhesion promoting agent, and 10 wt % of a siloxane modifier (polydimethylsiloxane (PDMS), diaminopropyl terminated) as the release agent, are respectively added into the first PAA solution to form. The respective weight ratios of the adhesion promoting agent and the release agent are based on the total weight of the release layer to form.

Examples 10-16 and Comparative Examples 6-10

Flexible substrate assemblies are prepared like in Example 9, except that the respective amounts of 3-aminopropyltriethoxysilane and the siloxane modifier respectively added into the first PAA solution as the adhesion promoting agent and the release agent are as indicated in Table 2.

Testing of Film Properties:

Adhesion Strength:

A cross-cut method can be used for evaluating the adhesion strength of the release layer 12 to the support base 10. The method includes providing a test sample having the release layer 12 formed on the support base 10. The test sample can have a size of 5 cm×5 cm. The test sample is cut with a crosshatch cutter into a lattice pattern of 100 small squares (i.e., 10×10) each having a size of 1 mm×1 mm. Each of the cutting lines cuts through the release layer 12 down to the support base 10. Then the tested area is diagonally brushed 5 times to remove particles. A tape (3M Transparent Tape 600 or 610) is subsequently applied over the crosshatch cut area. A rubber (or pencil eraser) can be pressed on the tape to smooth the tape on the tested sample. Then the tape is removed from the tested sample by rapidly pulling it off over itself close to an angle of 180°.

In accordance with ASTM standard D3359-95, the adhesion strength of the release layer 12 to the support base 10 can be evaluated on a scale from 5B to 0B based on observation. A rating of 5B can be given when the edges of the cuts are completely smooth and none of the squares in the lattice pattern is detached. A rating of 4B can be given when detachment of small flakes of the release layer 12 occurs at certain intersections of the cuts, the affected area being less than 5% of the total tested area. A rating of 3B can be given when the release layer 12 has flaked along the edges and at certain intersections of the cuts, the affected area being between 5% and 15% of the total tested area. A rating of 2B can be given when the release layer 12 has flaked along the edges of the cuts partly or wholly in large ribbons, or it has flaked partly or wholly on different parts at the intersections of the cuts, the affected area being between 15% and 35% of the total tested area. A rating of 1B can be given when the release layer 12 has flaked along the edges of the cuts partly or wholly in large ribbons, and it has flaked partly or wholly on different parts at the intersections of the cuts, the affected area being between 35% and 65% of the total tested area. A rating of 0B can be given when the release layer 12 has flaked along the edges of the cuts in large ribbons and some intersections of the cuts have detached partly or wholly, the affected area being greater than 65% of the total tested area. The rating of 5B would be required for a desirable adhesion strength between the release layer 12 and the support base 10.

Test of Peeling Strength:

Testing is conducted with a universal testing machine (Hounsfield H10ks) according to IPC-TM650 2.4.9 test method. A peeling strength between the release layer and the flexible substrate should be less than 0.1 kgf/cm for desirably peeling the flexible substrate from the release layer while the release layer remains adhered to the support base.

The test results obtained for Examples 1 through 8 and Comparative Examples 1 through 5 are shown in Table 1, and the test results obtained for Examples 9 through 16 and Comparative Examples 6 through 10 are shown in Table 2.

TABLE 1

| | Release layer | | | | |
|---|---|---|---|---|---|
| | Adhesion promoting agent (wt %) | Release agent | | Film forming ability | Adhesion strength (cross-cut test) | Peeling strength |
| | | Type | Amount (wt %) | | | |
| Example 1 | 1% | PTFE | 20% | ○ | 5B | <0.1 kgf/cm |
| Example 2 | 5% | PTFE | 20% | ○ | 5B | <0.1 kgf/cm |
| Example 3 | 5% | PTFE | 5% | ○ | 5B | <0.1 kgf/cm |
| Example 4 | 5% | PTFE | 45% | ○ | 5B | <0.1 kgf/cm |
| Example 5 | 10% | PTFE | 20% | ○ | 5B | <0.1 kgf/cm |
| Example 6 | 5% | Silicone | 5% | ○ | 5B | <0.1 kgf/cm |
| Example 7 | 5% | Silicone | 20% | ○ | 5B | <0.1 kgf/cm |
| Example 8 | 5% | Silicone | 45% | ○ | 5B | <0.1 kgf/cm |
| Comparative Example 1 | 0% | PTFE | 4% | ○ | 3B | >0.1 kgf/cm |
| Comparative Example 2 | 5% | PTFE | 50% | X | cannot be detected | >0.1 kgf/cm |
| Comparative Example 3 | 1% | Silicone | 4% | ○ | 4B | >0.1 kgf/cm |
| Comparative Example 4 | 15% | Silicone | 20% | ○ | 5B | >0.1 kgf/cm |
| Comparative Example 5 | 5% | Silicone | 50% | X | cannot be detected | >0.1 kgf/cm |

*X indicates that no release layer can be formed.

TABLE 2

| | Release layer | | | | |
|---|---|---|---|---|---|
| | Adhesion promoting agent (wt %) | Release agent Siloxane modifier (wt %) | Film forming ability | Adhesion strength (cross-cut test) | Peeling strength |
| Example 9 | 1% | 10% | ○ | 5B | <0.1 kgf/cm |
| Example 10 | 3% | 10% | ○ | 5B | <0.1 kgf/cm |

TABLE 2-continued

| | Release layer | | | | |
|---|---|---|---|---|---|
| | Adhesion promoting agent (wt %) | Release agent Siloxane modifier (wt %) | Film forming ability | Adhesion strength (cross-cut test) | Peeling strength |
| Example 11 | 5% | 10% | ○ | 5B | <0.1 kgf/cm |
| Example 12 | 10% | 10% | ○ | 5B | <0.1 kgf/cm |
| Example 13 | 5% | 5% | ○ | 5B | <0.1 kgf/cm |
| Example 14 | 5% | 20% | ○ | 5B | <0.1 kgf/cm |
| Example 15 | 5% | 45% | ○ | 5B | <0.1 kgf/cm |
| Example 16 | 10% | 45% | ○ | 5B | <0.1 kgf/cm |
| Comparative Example 6 | 0% | 10% | ○ | 3B | <0.1 kgf/cm |
| Comparative Example 7 | 15% | 10% | ○ | 5B | >0.1 kgf/cm |
| Comparative Example 8 | 15% | 45% | ○ | 5B | >0.1 kgf/cm |
| Comparative Example 9 | 5% | 0% | ○ | 5B | >0.1 kgf/cm |
| Comparative Example 10 | 5% | 50% | X | cannot be detected | <0.1 kgf/cm |

*X indicates that no release layer can be formed.

As indicated in Table 1 and Table 2, when only one of the adhesion promoting agent and the release agent is incorporated in the release layer (e.g., as shown in Comparative Examples 1, 6 and 9), the release layer cannot exhibit at the same time a desirable adhesion strength with respect to the support base and a sufficiently low peeling strength with respect to the flexible substrate. Moreover, no release layer can be formed when the release agent is added in an excessive amount, as shown in Comparative Examples 2, 5 and 10.

Examples 1 through 16 show that the addition of the adhesion promoting agent and the release agent in certain quantity ranges can provide at the same time a desirable adhesion strength between the release layer and the support base, and a peeling strength less than 0.1 kgf/cm between the release layer and the flexible substrate, thereby allowing effective peeling of the flexible substrate while the release layer remains adhered with the support base. Accordingly, the flexible substrate 14 can be mechanically peeled from the release layer 12 without laser detaching treatment.

Moreover, it can be observed that an excessive quantity of the adhesion promoting agent may cause the peeling strength to be greater than 0.1 kgf/cm, which may not allow easy peeling of the flexible substrate, or even cause the flexible substrate 14 to break during a peeling step.

Advantages of the flexible substrate assembly and fabrication method described herein include the ability to form and process a thin flexible substrate in a convenient manner without damaging the flexible substrate. After application of the requisite processing steps, the thin flexible substrate can be mechanically peeled off from a carrying support comprised of a rigid support base and a release layer adhered in contact with each other, which can be advantageously reused for fabricating and processing another flexible substrate.

Realizations of the flexible substrate assembly and method of fabricating flexible printed circuits have been described in the context of particular embodiments. These embodiments are meant to be illustrative and not limiting. Many variations, modifications, additions, and improvements are possible. These and other variations, modifications, additions, and improvements may fall within the scope of the disclosure as defined in the claims that follow.

What is claimed is:

1. A method of fabricating a flexible printed circuit, comprising:
    providing a carrying support comprised of a rigid support base and a release layer adhered in contact with each other, wherein the step of providing the carrying support includes coating and heating a first polyamic acid solution on the support base, the first polyamic acid solution containing an adhesion promoting agent including a silane compound, and a release agent including a fluoride-containing compound or a siloxane compound;
    forming a flexible substrate on the carrying support, the formed flexible substrate being adhered in contact with the release layer, wherein the step of forming the flexible substrate on the carrying support includes coating and heating a second polyamic acid solution on the release layer;
    while the flexible substrate is supported by the carrying support, applying one or more processing step on the flexible substrate; and
    while the release layer remains adhered in contact with the support base, peeling the flexible substrate with an electric circuit formed thereon from the release layer;
    wherein the release layer and the flexible substrate respectively comprise a polyimide layer.

2. The method according to claim 1, wherein
the release layer is a first polyimide layer that includes the adhesion promoting agent for promoting adhesion between the release layer and the support base, and the release agent for achieving a peeling strength between the release layer and the flexible substrate that is less than a peeling strength between the release layer and the support base.

3. The method according to claim 1, wherein the adhesion promoting agent is incorporated in a quantity between about 1 wt % and about 10 wt % based on the total weight of the release layer.

4. The method according to claim 1, wherein the release agent is incorporated in a quantity between about 5 wt % and about 45 wt % based on the total weight of the release layer.

5. The method according to claim 1, wherein the adhesion promoting agent is a silane compound, and the release agent is a siloxane compound.

6. The method according to claim 5, wherein the silane compound is incorporated in a quantity between about 1 wt % and about 10 wt % based on the total weight of the release layer, and the siloxane compound is incorporated in a quantity between about 5 wt % and about 45 wt % based on the total weight of the release layer.

7. The method according to claim 2, wherein the first polyimide layer is derived from reaction of diamine monomers with dianhydride monomers, the diamine monomers being selected from the group consisting of 4,4'-oxydianiline (4,4'-ODA), phenylenediamine (p-PDA), 2,2'-bis(trifluoromethyl)benzidine (TFMB), 1,3-bis(4-aminophenoxy)benzene (TPER), 1,4-bis(4-aminophenoxy)benzene (TPEQ), 2,2'-dimethyl[1,1'-biphenyl]-4,4'-diamine (m-TB-HG), 1,3'-bis(3-aminophenoxy) benzene (APBN), 3,5-diamino benzotrifluoride (DABTF), 2,2'-bis[4-(4-aminophenoxy) phenyl] propane (BAPP), 6-amino-2-(4-aminophenyl) benzoxazole (6PBOA) and 5-amino-2-(4-aminophenyl) benzoxazole (5PBOA), and the dianhydride monomers being selected from the group consisting of 3,3',4,4'-biphenyltetracarboxylic dianhydride (BPDA), 2,2-bis [4-(3,4dicarboxyphenoxy) phenyl] propane dianhydride (BPADA), pyromellitic dianhydride (PMDA), 2,2'-bis-(3,4-dicarboxyphenyl) hexafluoropropane dianhydride (6FDA), 4,4-oxydiphthalic anhydride (ODPA), and benzophenonetetracarboxylic dianhydride (BTDA), 3,3',4,4'-dicyclohexyltetracarboxylic acid dianhydride (HBPDA).

8. The method according to claim 1, wherein the flexible substrate formed on the release layer includes a second polyimide layer.

9. The method according to claim 8, wherein the second polyimide layer is derived from reaction of diamine monomers with dianhydride monomers, the diamine monomers being selected from the group consisting of 4,4'-oxydianiline (4,4'-ODA), phenylenediamine (p-PDA), 2,2'-bis(trifluoromethyl)benzidine (TFMB), 1,3-bis(4-aminophenoxy)benzene (TPER), 1,4-bis(4-aminophenoxy)benzene (TPEQ), 2,2'-dimethyl[1,1'-biphenyl]-4,4'-diamine (m-TB-HG), 1,3'-bis(3-aminophenoxy) benzene (APBN), 3,5-diamino benzotrifluoride (DABTF), 2,2'-bis[4-(4-aminophenoxy) phenyl] propane (BAPP), 6-amino-2-(4-aminophenyl) benzoxazole (6PBOA) and 5-amino-2-(4-aminophenyl) benzoxazole (5PBOA), and the dianhydride monomers being selected from the group consisting of 3,3',4,4'-biphenyltetracarboxylic dianhydride (BPDA), 2,2-bis [4-(3,4dicarboxyphenoxy) phenyl] propane dianhydride (BPADA), pyromellitic dianhydride (PMDA), 2,2'-bis-(3,4-dicarboxyphenyl) hexafluoropropane dianhydride (6FDA), 4,4-oxydiphthalic anhydride (ODPA), benzophenonetetracarboxylic dianhydride (BTDA), and 3,3',4,4'-dicyclohexyltetracarboxylic acid dianhydride (HBPDA).

10. The method according to claim 1, wherein the support base is made of a rigid material including glass, metal or silicon.

11. A method of fabricating flexible printed circuits, comprising:
providing a carrying support comprised of a rigid support base and a release layer adhered in contact with each other;
forming a first flexible substrate on the carrying support, the first flexible substrate being adhered in contact with the release layer;
forming a first electric circuit on the first flexible substrate;
while the release layer remains adhered in contact with the support base, peeling the first flexible substrate with the first electric circuit thereon from the release layer to expose a surface of the release layer;
forming a second flexible substrate on the exposed surface of the release layer, the second flexible substrate being adhered in contact with the release layer;
forming a second electric circuit on the second flexible substrate; and
while the release layer remains adhered in contact with the support base, peeling the second flexible substrate with the second electric circuit thereon from the release layer;
wherein the release layer and the flexible substrate respectively comprises a polyimide layer.

12. The method according to claim 11, wherein the step of providing a carrying support comprised of a rigid support base and a release layer adhered in contact with each other includes:
providing the support base; and
forming a first polyimide layer serving as the release layer on the support base, wherein the step of forming the first polyimide layer includes incorporating in a polyamic acid solution an adhesion promoting agent for promoting adhesion between the release layer and the support base, and a release agent for achieving a peeling strength less than 0.1 kgf/cm between the release layer and the first or second flexible substrate.

13. The method according to claim 12, wherein the adhesion promoting agent is incorporated in a quantity between about 1 wt % and about 10 wt % based on the total weight of the release layer.

14. The method according to claim 12, wherein the release agent is incorporated in a quantity between about 5 wt % and about 45 wt % based on the total weight of the release layer.

15. The method according to claim 12, wherein the adhesion promoting agent is a silane compound, and the release agent is a siloxane compound.

16. The method according to claim 15, wherein the silane compound is incorporated in a quantity between about 1 wt % and about 10 wt % based on the total weight of the release layer, and the siloxane compound is incorporated in a quantity between about 5 wt % and about 45 wt % based on the total weight of the release layer.

17. The method according to claim 11, wherein the step of providing a carrying support comprised of a rigid support base and a release layer adhered in contact with each other includes coating and heating a first polyamic acid solution on the support base, and the step of forming a first flexible substrate or the step of forming a second flexible substrate includes coating and heating a second polyamic acid solution on the release layer, wherein the first polyamic acid solution contains an adhesion promoting agent including a silane compound, and a release agent including a fluoride-containing compound or a siloxane compound.

* * * * *